United States Patent
Tran et al.

(10) Patent No.: US 9,404,977 B2
(45) Date of Patent: Aug. 2, 2016

(54) BIDIRECTIONAL DC CONVERTER-BASED BATTERY SIMULATOR

(71) Applicant: Ford Global Technologies, LLC, Dearborn, MI (US)

(72) Inventors: Tuyen Q. Tran, Dearborn, MI (US); Ben A. Tabatowski-Bush, South Lyon, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 169 days.

(21) Appl. No.: 14/255,381

(22) Filed: Apr. 17, 2014

(65) Prior Publication Data
US 2015/0301120 A1    Oct. 22, 2015

(51) Int. Cl.
*G01R 31/327*    (2006.01)
*G01R 31/02*    (2006.01)
*G01R 31/36*    (2006.01)

(52) U.S. Cl.
CPC .......... *G01R 31/3651* (2013.01); *G01R 31/361* (2013.01); *G01R 31/3658* (2013.01)

(58) Field of Classification Search
CPC .............. H02J 7/0031; H02J 2007/004; H02J 2007/0037; H02J 7/0021; Y02E 60/12; H01M 10/48; G01R 31/3658; G01R 19/16542; G01R 31/3648
USPC ........................................................ 324/434
See application file for complete search history.

(56) References Cited

U.S. PATENT DOCUMENTS

| | | | | |
|---|---|---|---|---|
| 7,786,699 B2* | 8/2010 | Demers | ................ | H02J 7/0014 320/116 |
| 8,111,038 B2* | 2/2012 | Wang | ................ | B60L 11/1816 180/165 |
| 2006/0255769 A1* | 11/2006 | Liu | ................ | H01M 10/441 320/134 |
| 2008/0012531 A1* | 1/2008 | Chang | ................ | H02J 7/0016 320/134 |
| 2010/0039070 A1* | 2/2010 | Hargett | ................ | B60L 11/1809 320/137 |
| 2011/0054816 A1* | 3/2011 | Prada | ................ | G01R 31/3624 702/63 |
| 2012/0074949 A1 | 3/2012 | Kepley et al. | | |
| 2013/0207616 A1* | 8/2013 | Shim | ................ | H02J 7/0019 320/136 |

OTHER PUBLICATIONS

Huang, Mishi, et al., "Novel Bi-Directional AC-DC Converter for Electrical Vehicle Battery Testing", Dept. of Electrical Engineering, Nat. Taipei University of Technology, Taiwan, http://www.oia.ntut.edu.tw/ezfiles/83/1083/img/1488/29.pdf.

* cited by examiner

*Primary Examiner* — Arun Williams
(74) *Attorney, Agent, or Firm* — Maristyn Law LLC; Lynda F. Kouroupis; David B. Kelley (57) ABSTRACT

A battery simulator is configured to provide large energy pulses for hot plug testing while maintaining the ability to quickly respond during random order testing. A simulator can comprise a plurality of cell simulators "cellsims" coupled to a DC power supply. Each cellsim can include a bidirectional DC converter, a bulk capacitor on the primary side of the converter, and a switchable discharge capacitor on the secondary side of the converter. The bidirectional DC converter enables the simulator to cooperate with a battery control module (BCM) to perform active cell balancing. Energy received from the BCM can be stored at the bulk capacitor. The discharge capacitor can be coupled to an output link to provide a high energy pulse to the BCM to simulate hot plug conditions, and can be decoupled from the link during random order testing. Output link voltage and current can be monitored for fault detection.

17 Claims, 5 Drawing Sheets

FIG. 5 ized by design constraints. For example, reduces their effectiveness for hot plug testing of a battery control module. As a result, battery control modules that successfully pass tests conducted with a battery simulator are often damaged by inrush current when connected to an actual traction battery at a vehicle. Finally, battery simulators usually include a unidirectional DC converter configured to provide energy from the simulator to a control module, where the energy is typically dissipated as heat. Contemporary EV battery control modules can be designed for active self-balancing in which energy from one battery cell can be provided to a different battery cell. To test a battery control module configured for active self-balancing, it is desired that a battery simulator be configured to simulate the charge balancing process. Simulation of energy transfer between battery cells is not possible with prior art simulators designed to transfer energy only from a simulated cell to a battery control module.

BIDIRECTIONAL DC CONVERTER-BASED BATTERY SIMULATOR

FIELD OF INVENTION

This invention relates generally to battery simulators, and more particularly to battery simulators designed to simulate operation of a traction battery for an electrified vehicle.

BACKGROUND OF INVENTION

In electrified vehicles, a high energy storage device provides traction power for motoring operations. In many cases the energy storage device is in the form of a high voltage battery, such as a lithium-ion battery, composed of a plurality of electrically coupled energy cells. Typically, a battery control module is coupled to a traction battery to monitor battery cell charge. To decrease test and evaluation costs, a battery simulator, rather than an actual traction battery, is often used to test a battery control module. A battery simulator is composed of a plurality of electronic devices designed to simulate the activity of a plurality of battery cells. To test a battery control module for a 36-cell battery, a battery simulator or battery tester designed to simulate 36 cells is used. A script based on a record of an actual vehicle drive cycle can be used put the simulator and control module through the fluctuating energy demands placed on an actual EV battery.

In the prior art, the capacity of a battery simulator to test a battery control module under a variety of operational conditions is somewhat limited by design constraints. For example, many simulators employ a low voltage power source that may only provide around 4-5 amps of current, much lower than the current typically provided by an actual traction battery. Some simulators, relying on very large sized capacitors to simulate energy storage capacity, may have slow response times when subjected to quick, random order testing. When optimized to better simulate vehicle dynamics and response times, a simulator may fail to represent energy storage capacity of a real battery cell. For example, simulators often provide lower energy pulses to a battery control module than those provided by an actual battery, reducing their effectiveness for hot plug testing of a battery control module. As a result, battery control modules that successfully pass tests conducted with a battery simulator are often damaged by inrush current when connected to an actual traction battery at a vehicle. Finally, battery simulators usually include a unidirectional DC converter configured to provide energy from the simulator to a control module, where the energy is typically dissipated as heat. Contemporary EV battery control modules can be designed for active self-balancing in which energy from one battery cell can be provided to a different battery cell. To test a battery control module configured for active self-balancing, it is desired that a battery simulator be configured to simulate the charge balancing process. Simulation of energy transfer between battery cells is not possible with prior art simulators designed to transfer energy only from a simulated cell to a battery control module.

SUMMARY OF THE INVENTION

An example system includes a battery control module (BCM) configured to monitor charge of one or more cells of a traction battery for an electrified vehicle, and a battery simulator, configured for bidirectional energy exchange with said BCM, configured to simulate operation of the traction battery. Because the battery simulator is configured for bidirectional energy exchange with the BCM, it can be used to test BCM active self-balancing capability.

An example battery simulator can include a plurality of cell simulators (cellsims) coupled to a power supply, with each cellsim configured to simulate a cell of an electrified vehicle (EV) traction battery. At least one of the cellsims is configured for bidirectional energy exchange with a BCM. In an example embodiment, each cellsim comprises a bidirectional DC/DC converter configured for energy exchange with the BCM and is configured to cooperate with the BCM to perform active cell balancing.

In an example embodiment, a battery simulator comprises a plurality of cellsims, with each cellsim comprising a discharge capacitor that is switchably coupled to an output link between the cellsim and the BCM. When the discharge capacitor is switched on, it is coupled to an output link. Energy stored in the discharge capacitor can be released to a battery control module, simulating the release of a high energy pulse that can occur when a battery control module is plugged into a battery pack. The ability to provide such a pulse makes the present simulator suitable for hot plug testing of a battery control module. When the discharge capacitor is switched off, i.e decoupled from the output link, the battery simulator can provide the dynamic response of a traction battery during a vehicle drive cycle. Thus, a battery simulator of the invention can represent energy storage characteristics of a battery cell, as well as provide quick responses during random order testing.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the specification. The figures are not drawn to scale and related elements may be omitted so as to emphasize the novel features of the invention. Structural and functional details depicted in the figures are provided for the purpose of teaching the practice of the invention to those skilled in the art, and are not to be interpreted as limitations. For example, control modules for various systems can be variously arranged and/or combined and may not be depicted in illustrations of example embodiments herein in order to better emphasize novel aspects of the invention. In addition, system components can be variously arranged as known in the art.

Figure 1:
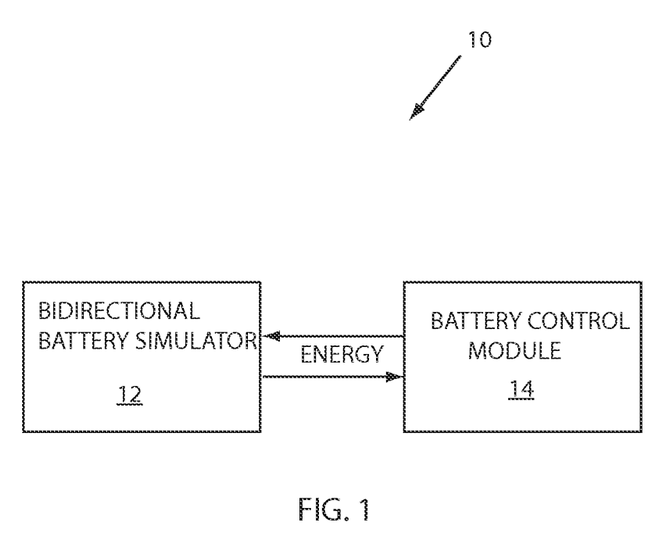
FIG. 1 shows an example system of the invention.

Turning now to the several Drawings, in which like reference numerals refer to like elements throughout the several views, FIG. 1 shows a system 10 in which a bidirectional battery simulator (BBS) 12 is coupled to a battery control module (BCM) 14. As indicated by the pair of opposing arrows, energy can be transferred from the BBS 12 to the BCM 14, and from the BCM 14 to the BBS 12. In an example embodiment, the BBS 12 is embodied as a simulator for a 24-cell lithium ion battery commonly installed at an electrified vehicle to provide traction power. Accordingly, the BCM 14 is in the form of a battery control module for a 24-cell lithium ion battery configured to perform various functions, such as, but not limited to, monitoring and reporting a state-of-charge for the traction battery. Generally, a battery control module is disposed within a battery pack when a battery pack is installed at an electrified vehicle. Bidirectional energy exchange between the BBS 12 and the BCM 14 enables active cell-balancing features of a battery system to be tested. In addition, as will be discussed in greater detail herein, advantageous aspects of the BBS 12 make it well-suited for hot plug testing of the BCM 14.

Figure 2:
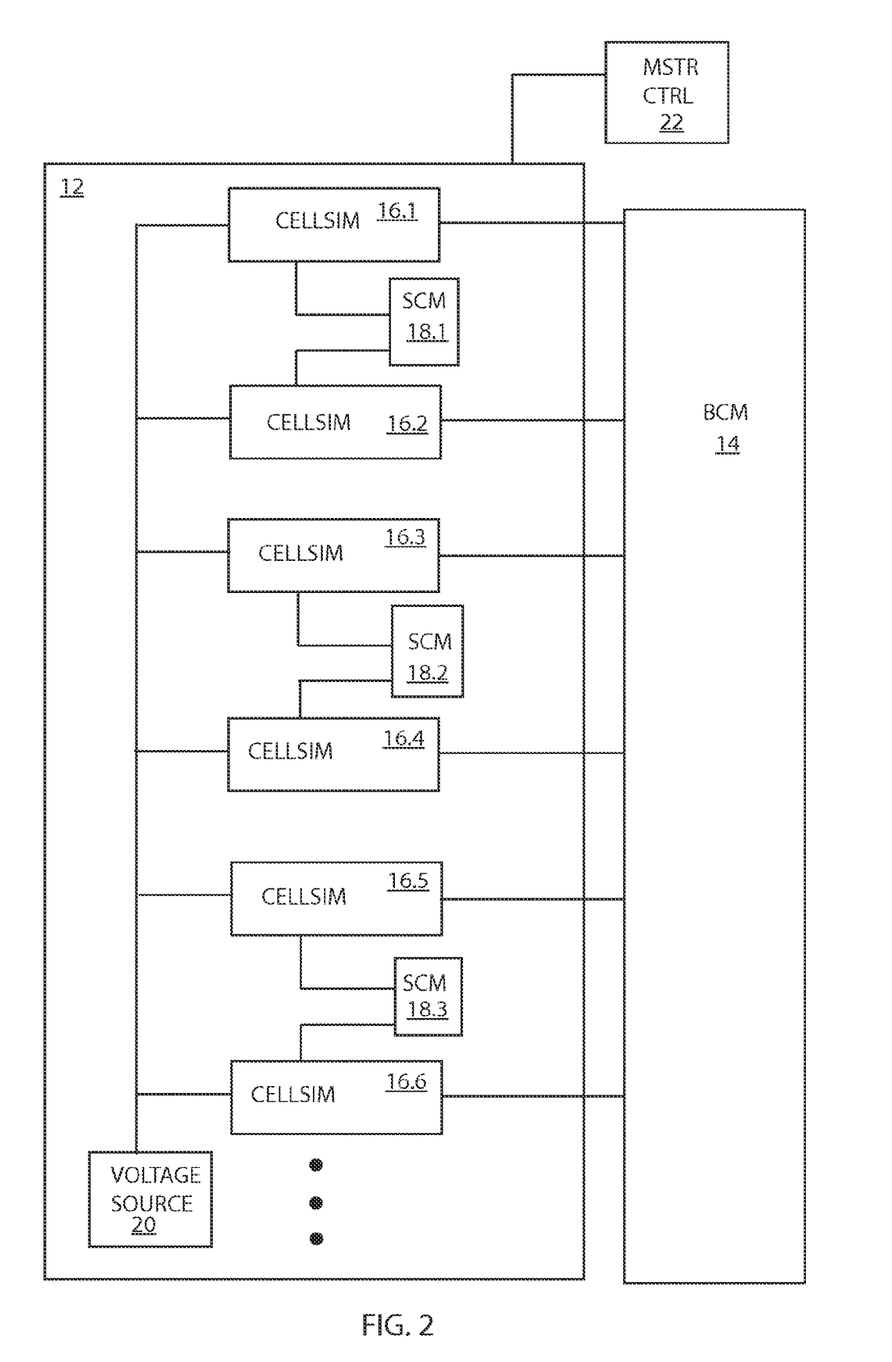
FIG. 2 shows an example battery simulator.

FIG. 2 shows a block diagram of an example configuration for the BBS 12. A plurality of cell simulators 16.$i$, hereinafter referred to as "cellsims", each of which is configured to represent and simulate a single cell of an EV traction battery pack, can be coupled to a voltage source 20. In the drawings, the index "i", which can range from 1 to N, with N representing the total number of cellsims provided by the BBS 12, distinguishes a first cellsim 16 from a second cellsim 16. However, it is understood that each cellsim 16 has identical components. The total number N of cellsims 16 within the BBS 12 can vary, depending on the type of battery the BBS 12 is configured to simulate. For example, to test a battery control module for a 36-cell battery, a simulator having 36 cellsims is required. In an example embodiment, the voltage source 20 can be in the form of a DC power supply, such as a 24V power supply, coupled to the cellsims 16.

A cellsim control module (CCM) 18.$x$ ($x$=1 to M, M=total number of control modules) can be disposed to control and monitor the operation and output of the cellsim 16.$i$. In the drawings, the value for "x" is used to distinguish among multiple identical CCMs 18. In an example embodiment, as shown in FIG. 2, the CCM 18.1 can be coupled to two cellsims, 16.1 and 16.2; however other arrangements in which the CCM 18 is coupled to one, or more than two cellsims 16 are contemplated. The CCM 18 can comprise hardware, software, firmware, or some combination thereof. In an example embodiment, the CCM 18 comprises a computing device such as a digital processor, and a computer-readable medium operatively coupled to the digital processor having stored thereon logic for sequences of instructions for said digital processor, the sequences of instructions, when executed by said digital processor, cause the processor to perform the various CCM 18 tasks.

During a testing exercise, a master controller 22, can be configured to control the total voltage of, and provide a testing sequence for, the BBS 12. For example, the master controller 224 can be in the form of a computing device coupled to the BBS 12 and configured to impose variable voltage commands as part of a test script. By way of example, the test script can include voltages recorded during a drive cycle of an electrified vehicle so that realistic conditions can be simulated.

Figure 3:
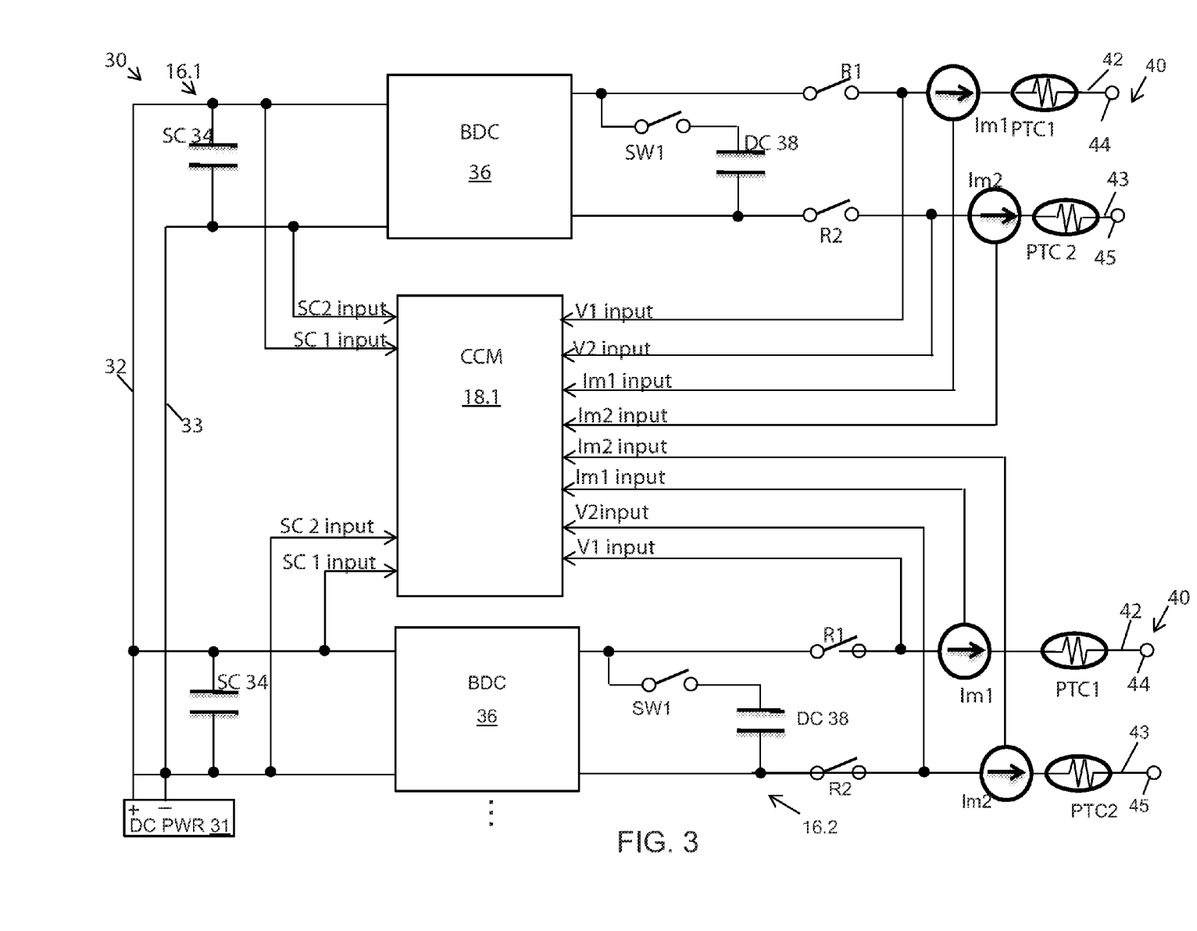
FIG. 3 shows an example battery simulator circuit.

FIG. 3 depicts an example circuit 30 for the BBS 12. In the following discussion of FIG. 3, for the sake of brevity in the text and clarity in the drawing, the indices "i" and "x" are omitted for components other than the cellsims 16.1 and 16.2, and the CCM 18.1. Furthermore, while aspects of the invention are discussed with respect to cellsim 16.1, it is understood that the features and advantages of cellsim 16.1 also apply to cellsim 16.2. Likewise, it is understood that control operations performed by the CCM 18.1 for the cellsim 16.1 are also performed for the cellsim 16.2 A 24V DC power supply 31 can be configured to provide a source of DC power for the BBS 12. By way of example, the power supply 31 is coupled to each cellsim 16 by a positive voltage bus 32 and a negative voltage bus 33. Energy from the cellsim 16.1 can be provided to the BCM 14 via a link 40 that comprises a positive bus 42 and a negative bus 43 that can terminate at connector terminals 44 and 45, configured for coupling the BBS 12 and the BCM 14. In an example embodiment, the cellsim 16.1 comprises a bulk storage capacitor (SC) 34, a bidirectional DC/DC converter (BDC) 36, and a discharge capacitor 38.

The (SC) 34 can be sized to achieve desired performance characteristics. In an example embodiment, the SC 34 is sized to provide the energy necessary to cooperate with the discharge capacitor 38 to provide a sufficiently large energy pulse that simulates the pulse provided to a BCM when it is initially plugged into a battery simulator. Prior art simulators often include a power supply accompanied by some sort of bulk capacitors. A problem of prior art simulators, however, is that bulk capacitors are often included randomly rather than purposefully selected to satisfy specific energy requirements. Making matters worse, in prior art simulators, the bulk capacitor typically provides the only energy storage capability. When the energy of the bulk capacitor is passed through a DC converter to the battery control module, losses inevitably occur due to the switches, magnetics, etc. associated with the converter. Thus, prior art simulators generally are unable to provide a sufficiently high pulse to replicate hot plug conditions. The present invention includes a suitably sized bulk capacitor that, together with the discharge capacitor 38, can more effectively represent energy capacities at an actual traction battery cell.

The BDC 36 enables the battery simulator 12 to both provide energy to and receive energy from the BCM 14. Configuring battery packs and control modules for active cell balancing capability is a relatively recent innovation in the electrified vehicle industry. Simulation of this feature requires a battery simulator to be able to receive energy from a battery control module as well as provide energy to a battery control module. Battery simulators or testers of the prior art, designed for only unidirectional energy transfer out from the tester, are unable to test this feature of a battery pack control module. Via the link 40, energy can be exchanged in both directions between the BDC 36 and the BCM 14. A first relay R1 can be disposed at the positive bus 42, and a second relay R2 can be disposed at the negative bus 43 to controllably couple the BDC 36 and the discharge capacitor 38 to the link 40.

The discharge capacitor 36 can be controllably coupled to the BDC 36 and the link 40 by a switch SW1. When the switch SW1 is closed, the discharge capacitor 36 can receive and store energy from the bidirectional converter 34. Closure of the relays R1 and R2 while the switch SW1 is closed couples the discharge capacitor 36 to the output link 40. When the BCM 14 is connected to the BBS 12, energy stored at the discharge capacitor 36 can be released in a large pulse to the BCM 14, simulating the type of energy release that occurs when a battery control module is first plugged in to an actual battery pack. Energy stored in the SC 34 can also be released to the BCM 14 through the BDC 36. Opening the switch SW1 disconnects the discharge capacitor 36 from the link 40, while allowing the BDC 36 to remain coupled to the link 40. The BBS 12 can be configured to transfer energy to the BCM 14 through the BDC 36 to simulate EV battery cell activity during an EV drive cycle. Thus, the switch SW1 is configured to enable the BBS 12 to simulate hot plug conditions in addition to electrified vehicle drive mode conditions.

Current sensors M1 and M2 can be disposed to monitor current flow between the cellsim 16 and the BCM 14 and provide feedback to the CCM 18. In an example embodiment, current limiters, such as positive temperature coefficient (PTC)1 and PTC2 can be disposed at the link 40 to prevent current between the BBS 12 and the BCM 14 from becoming too high, providing protection for electronic devices at each of the apparatus.

The CCM 18.1 can be configured to monitor and control cellsim 16.1 and cellsim 16.2 state and operation. The CCM 18.1 can be configured to receive the BDC 36 input voltage, i.e. the SC 34 voltage, through the SC1 and SC2 inputs. The CCM 18 can also be configured to receive link 40 voltage via the V1 and V2 inputs, and the link 40 current from the current sensor Im1 and Im2 inputs. The CCM 18 can be configured to control BDC 36 operation through control connections (not shown) with the BDC 36. By way of example, the CCM 18.1 can be configured to control the power flow direction, i.e. whether power is transferred from cellsim 16.1 to the BCM 14, or from the BCM 14 to the cellsim 16.1, as well as the power magnitude, through its control of the BDC 36. For example, energy can be transferred from the SC 32 to the BCM 14 in one direction across the BDC 36, and from the BCM 14 to the SC 32 in the opposite direction across the BDC 36. The CCM 18.1 can use cellsim 16.1 input and output, as well as input from the master controller 22 (FIG. 2) to provide local control for the one or more BDC 36 to which it is coupled.

The CCM 18.1 can also provide fault detection using input from the link 40. In an example embodiment, the current sensors Im1 and Im2 provide high bandwidth monitoring of the link 40 current. The CCM 18.1 can be configured to compare the current and voltage at the link 40 to a predetermined threshold. If the link 40 current and/or voltage is not within a predetermined acceptable range, the CCM 18.1 can cooperate with the master controller 22 (FIG. 2) to shut down BBS 12 operation. By way of example, the cellsim 18.1 can open the relays R1 and R2 at the cellsim 16.1 and 16.2, disconnecting the cellsims 16.1 and 16.2 from the BCM 14. The CCM 18.1 can be configured to send a fault message to the master controller 22 via a data interface (not shown) between by them. In an example embodiment, in response to receiving a fault message from the cellsim 18.1, the master controller 22 can be configured to command remaining cellsims 18.x to open their respective relays R1 and R2, and can also power down the BBS 12. By monitoring the current provided to the BCM 14 by the cellsims 16.1 and 16.2, and providing a quick response when predetermined limits are violated, the CCM 18.1 can protect the BCM 14 against damage, particularly damage that can result when a failed module continues to receive current. The CCM 18.1 can provide fault detection during all phases of BCM 14 testing.

Figure 4:
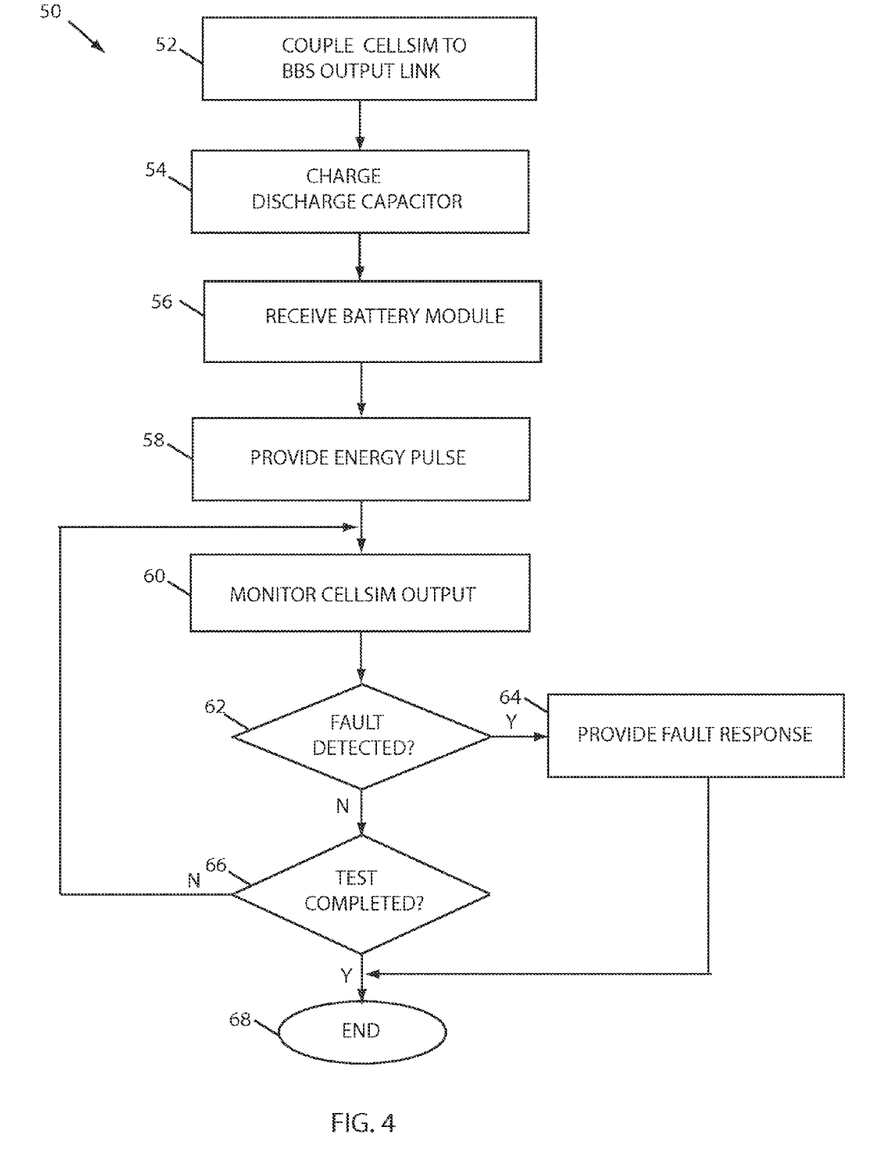
FIG. 4 shows a flow diagram of an example method for hot plug testing a battery control module.

As mentioned above, the BBS 12 can be used to perform hot plug testing of the BCM 14, as well as simulated vehicle drive cycle testing, during which BCM 14 active cell-balancing capability can be tested. FIG. 4 shows an example method 50 for hot-plug testing of a battery control module coupled to a BBS of the invention. At block 52, a cellsim can be coupled to an output link configured to electrically couple a simulated cell with a battery module. For example, the CCM 18.1 can close relays R1 and R2 of cellsims 16.1 and 16.2, coupling the BDC 36 to the link 40, enabling cellsim 16.1, 16.2 output to be provided at the respective terminals 44 and 45. A CCM 18.x can perform this action, and other actions described in the method 50, for each cellsim 16.i under its control. At block 54, a cellsim discharge capacitor can be charged. For example, the CCM 18.1 can close the switch SW1 at the cellsim 16.1, connecting the discharge capacitor 38 to the BDC 36, and do the same for the cellsim 16.2. The CCM 18.1 can turn on the BDC 36 on so that energy can be provided to, and stored at, the discharge capacitor 38. Charging the discharge capacitor 38 with the relays R1 and R2 closed can also energize the link 40, providing a voltage between the positive and negative buses 42 and 43 at the terminals 44 and 45. At block 56, a battery control module can be received at a BBS. For example, the BCM 14 can be plugged into the BSS 12 at the terminals 44 and 45. At block 58 an energy pulse can be provided to a battery control module, for example, the BSS 12 can provide a high energy pulse to the BCM 14. When the BCM 14 is electrically coupled to the BSS 12, the discharge capacitor 38 can release its stored energy to the BCM 14 as a large energy pulse, simulating what occurs when a battery control module is plugged into a traction battery. In general, a constant voltage is maintained at an actual battery cell during a hot plug energy pulse. Accordingly, the BBS 12 can be configured to do the same. The inputs V1 and V2, IM1 and IM2 enable the CCM 18 to monitor cellsim 16 output during a pulse. If the BCM 14 draws enough energy out of the discharge capacitor 38 that the voltage on the link 40 decreases, the CCM 18 can turn on the BDC 36 so that a desired constant voltage can be maintained. However, it is conceivable that energy may be released too quickly for the CCM 18 to monitor and respond in time to maintain a constant voltage during the pulse. Accordingly, it is contemplated that the CCM 18 can be configured to turn the BDC 36 on during a pulse, regardless of link 40 feedback, to ensure access to energy stored in the bulk storage capacitor 34 so that a constant cellsim 16 voltage can be maintained. At block 60, post pulse behavior of the BSS 12 can be monitored and controlled. If a hot-plug test is successful, a system comprising a coupled BBS and battery control module typically reaches a steady-state condition where current draw at the battery control module ceases after the initial energy pulse. However, if a battery control module fails during a hot-plug test, it may continue to draw a large current that, if left unchecked, can significantly damage the battery control module. Using the IM1 and IM2 input, the CCM 18 is able to detect the continued large current draw and is also able to detect a rapidly declining voltage on the link 40 from the V1 and V2 input. At block 62, a decision can be made as to whether a fault exists. The CCM 18 can compare current and voltage feedback to predetermined thresholds to determine whether a fault condition exists. At block 64, the BSS 12 can respond to any detected faults. By way of example, a fault response by the CCM 18 can comprise shutting down a battery simulator-battery control module system and triggering an operator alarm at the BSS 12. For example, the CCM 18.1 can open the relays R1 and R2 of the cellsim 16.1, decoupling the BBS 12 from the BCM 14. In addition, the CCM 18.1 can open the switch SW1 and turn off the BDC 36. The CCM 18.1 can also provide a fault message to the master controller 22, and trigger a fault alarm at the BBS 12 to alert an operator. In an example embodiment, a test can end at block 68 after a fault response is performed. At block 66, a decision can be made as to whether a test has been completed. In an example embodiment, a test can end when equilibrium conditions are reached. For example, the CCM 18 can use voltage inputs V1 and V2, and current inputs Im1 and Im2 to determine that a simulator-battery control module system has reached equilibrium/steady state conditions. Other ways of determining a test is completed, including a CCM 18 receiving a "TEST COMPLETE" message from the master controller 22, will occur to those skilled in the art. If the test is not finished, the method 50 can continue at block 60. If a test is completed, then the method 50 can terminate at block 68. In an example embodiment, a battery simulator of the invention can decouple a discharge capacitor from an output link when a hot plug test is finished. For example, the CCM 18.1 can open the switch SW1 at the cellsim 16.1 and 16.2 to decouple the discharge capacitor 38 from the link 40. If no additional testing is to be performed, the CCM 18.1 can turn off the BDC 36 and open the relays R1 and R2 at the cellsims 16.1 and 16.2, decoupling them from the BCM 14. However, it is contemplated that upon completion of a hot plug test, a drive cycle test can be administered in which a battery simulator is tasked to replicate conditions experienced by a traction battery during a vehicle drive cycle. If so, after a discharge capacitor is decoupled from an output link, relays coupling a cellsim to a battery control module can remain closed.

Figure 5:
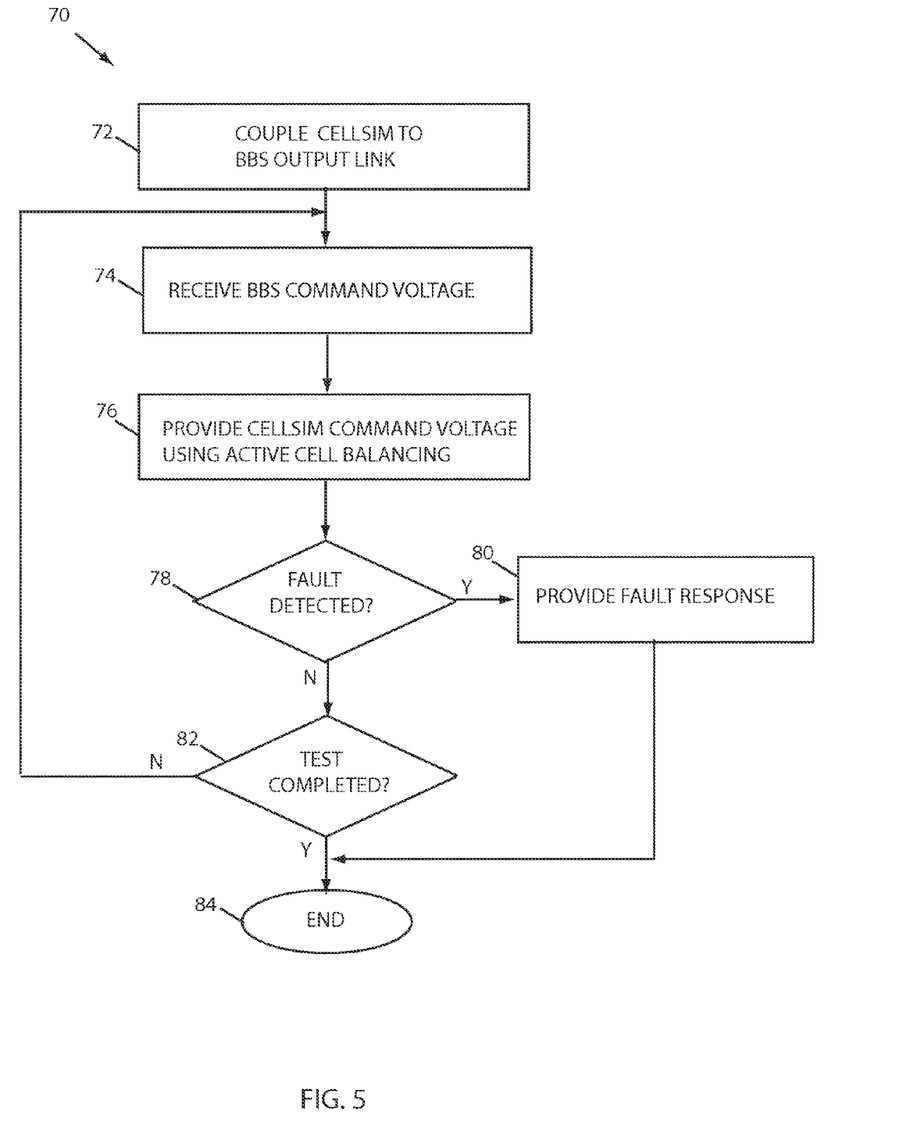
FIG. 5 shows a flow diagram of an example method for testing a battery control module under vehicle drive mode conditions.

FIG. 5 shows an example method 70 for drive cycle testing of a battery control module. At block 72 a cell simulator can be coupled to an output link of a battery simulator. For example, the CCM 18.1 can close the relays R1 and R2 of the cellsims 16.1, 16.2, coupling the cellsims 16.1 and 16.2 to the output link 40. In an example embodiment, drive cycle testing does not include providing energy to a BCM from a discharge capacitor. The CCM 18 can be configured to check SW1 status and open it if it is closed, so that the discharge capacitor 38 is decoupled from the BDC 36 and the link 40, turning the discharge capacitor 38 OFF. At block 74 a test command voltage can be received. By way of example, each CCM 18 can receive a a battery pack voltage command from the master controller 22. As discussed previously herein, the battery pack voltage command can be based on voltage data recorded during a drive cycle of an electrified vehicle. At block 76 a cellsim command voltage can be provided. In an example embodiment, each BCM 18 of the BBS 12 can be configured to use the voltage command received from the master controller 24 to determine a command voltage for the one or more cellsims 16 to which it is coupled. By way of example, the CCM 18 can be configured to determine a voltage command for each cellsim 16 by dividing the total battery pack command voltage by the number of simulated cells at a battery simulator.

Having determined a cellsim command voltage, the CCM 18.1 can cause the cellsim 16.1 to provide the cellsim command voltage across the terminals 44, 45 of the voltage link 40. By way of example, the CCM 18.1 can use the V1 and V2 inputs for the cellsim 16.1 to detect the voltage present at the output link 40. The CCM 18.1 can be configured to operate the BDC 36 of the cellsim 16.1 to increase or decrease the cellsim voltage as necessary to comply with the cellsim command voltage. If the present cellsim 16.1 voltage is less than the cellsim command voltage, the CCM 18.1 can be configured to turn on the DC converter 36 of the cellsim 16.1 to boost the voltage at the output link 40. If the output link 40 voltage is greater than the cellsim command voltage, the CCM 18.1 can be configured to turn off the BDC 36, and allow current drawn by the BCM 14 to reduce the voltage at the link 40 until the cellsim command voltage is reached. The CCM 18.1 can control the BDC 36 operation as necessary to maintain the cellsim command voltage.

As discussed previously, a battery control module may be designed to perform active cell-balancing in which energy received from a battery pack, rather than being dissipated as heat, is returned to the battery pack. Accordingly, in an example embodiment, the BBS 12 is configured to cooperate with the BCM 14 to perform active cell-balancing in which energy transferred to the BCM 14 from the BBS 12 to achieve a command voltage can be returned to the BBS 12. In an example embodiment, energy released from a first "donor" cellsim can be provided to a second "receiver" cellsim, which preferably is controlled by the same CCM 18. For example, the CCM 18.1 can be configured to cooperate with the BCM 14 so that energy provided to the BCM 14 from the cellsim 16.1 can be provided to the cellsim 16.2, and vice versa.

For example, in response to a received battery pack command voltage, the CCM 18.1 can turn on the BDC 36 of the cellsim 16.1 so that energy is transferred from the BBS 12 to the BCM 14 by output current at the link 40. By way of example, the energy can be stored at a storage inductor (not shown) at the BCM 14. After a period of inductor charging, the CCM 18.1 can turn off the BDC 36 of cellsim 16.1. The CCM 18.1 can turn on the BDC 36 of the cellsim 16.2 so that energy received from the BCM 14 via input current at the link 40 can be provided to, and stored at, the SC 34 of cellsim 16.2. The CCM 18 can monitor SC 34 voltage via the inputs SC1 and SC2. In an example embodiment, the BDC 36 of the cellsim 16.2 can be turned off when a predetermined maximum voltage is reached at the SC 34, or when energy stored at a BCM 14 inductor is expended, a condition detectable from the inputs IM1 and IM2. The energy stored at the SC 34 can be used to comply with a subsequent cellsim command voltage.

At block 78 a determination can be made as to whether a fault condition exists. By way of example, each CCM 18 can monitor cellsim input/output via the V1, V2, IM1 and IM2 inputs to ensure that a cellsim command voltage is maintained, and to detect faults that may occur. For example, falling voltages and/or large current draws can be indicative of a fault at the BCM 14. Voltage and current levels can be compared to a predetermined fault threshold. If a fault is detected, the BBS 12 can perform a fault response at block 80. Example fault responses can include opening relays R1 and R2, turning off the BDC 36 of one or more cellsims 16, and triggering an operator alarm at the BBC 12. In an example embodiment, a test can end at block 84 after a fault has been detected and a fault response has been performed. However, it is contemplated that in an alternative embodiment, a plurality of thresholds can be used to determine whether a fault is significant or insignificant, and a method can continue to block 82 if a detected fault is not significant.

At block 82 a determination can be made as to whether testing is finished. By way of example, an end test signal can be received from the master controller 22 when a testing script is finished. If an end test signal is received, the method can proceed to block 84 where the method 50 can end. In an example embodiment, the method 50 can conclude with a shutting down of a battery simulator. For example, each CCM 18 can open relays R1 and R2, and turn off the BDCs 36 of the cellsims 16 under its control. If a test is not finished, the method can continue at block 74 and an additional BBS command voltage can be received. Thus, the invention provides a battery simulator, or battery tester, that combines the energy storage advantages of bulk capacitor simulators with the responsiveness advantages of DC power supply based simulators. Accordingly, a battery simulator can be used for both hot plug testing and drive cycle testing of a battery control module for an electrified vehicle. In the past, battery testers were unable to provide the high energy pulse that occurs when a battery control module is plugged into an actual battery. As a result, battery control modules that tested successfully, often failed when actually installed at a vehicle. In the present invention, a switchable discharge capacitor can store and release the energy to simulate an actual hot plug pulse. Energy provided by a discharge capacitor can be supplemented by energy stored at a bulk capacitor when a DC/DC converter is turned on. When a drive cycle test script is administered, the discharge capacitor can be switched off, i.e. disconnected from an output link, and energy provided by a DC converter can be used to provide a test script command voltage.

Equipped with a bidirectional DC-DC converter, a bidirectional battery simulator can be configured to test active cell-balancing capability of a battery control module since it can both transfer energy to and receive energy from, the battery control module. A further advantage of the present invention is its improved ability to simulate battery cell current. Prior art battery testers typically provide current of only a few milliamps, much less than that provided by most actual traction battery cells. The present simulator can provide currents of 2 or more amps, better imitating the dynamics of an actual traction battery. In addition, a battery simulator of the present invention can provide improved protection for a battery control module being tested. A control module configured to provide local control for simulated cells of a tester can monitor both voltage and current at the link coupling the tester with a battery control module. If a fault is detected, the tester can be decoupled from the battery control module to mitigate damage incurred as a result of the fault condition.

As required, illustrative embodiments have been disclosed herein, however the invention is not limited to the described embodiments. As will be appreciated by those skilled in the art, aspects of the invention can be variously embodied, for example, modules and programs described herein can be combined, rearranged and variously configured. Methods are not limited to the particular sequence described herein and may add, delete or combine various steps or operations. The invention encompasses all systems, apparatus and methods within the scope of the appended claims.

The invention claimed is:

1. A system, comprising:
   a battery control module (BCM) configured to monitor charge of one or more cells of an electrified vehicle (EV) traction battery;
   a simulator, configured for bidirectional energy exchange with said BCM, configured to simulate operation of said traction battery;
   wherein said simulator comprises a bidirectional DC/DC converter; and
   wherein said simulator comprises a discharge capacitor configured to store energy received from said bidirectional DC/DC converter and release said stored energy to said BCM during a hot plug test.

2. The system of claim 1, further comprising a bulk storage capacitor.

3. The system of claim 1, wherein said BCM and said simulator are configured to perform active cell balancing.

4. A battery simulator, comprising:
   a power supply;
   one or more cell simulators (cellsims) coupled to said power supply, each said cellsim configured to simulate a cell of an electrified vehicle (EV) traction battery;
   wherein said cellsim comprises a bidirectional DC/DC converter configured for bidirectional energy exchange with a battery control module (BCM) configured to monitor said traction battery charge, and a discharge capacitor configured to store energy received from said converter and controllably release said stored energy to a link coupling said cellsim and said BCM.

5. The battery simulator of claim 4, further comprising at least one cellsim control module (CCM), each said CCM configured to control operation of at least one of said cellsims.

6. The battery simulator of claim 5, wherein said CCM is configured to monitor current between said cellsim and said BCM.

7. The battery simulator of claim 4, configured to cooperate with said BCM to perform active cell balancing.

8. The battery simulator of claim 4, wherein said active cell balancing comprises a donor cellsim providing energy to said BCM, and a receiver cellsim receiving said energy from said BCM.

9. The battery simulator of claim 4, configured to store energy received from said BCM at a bulk capacitor at said cellsim.

10. The battery simulator of claim 4, wherein said cellsim comprises a switch disposed between said discharge capacitor and said converter.

11. A battery simulator, comprising:
   a power supply; and
   at least one cell simulator (cellsim), said cellsim configured to simulate an energy cell of an electrified vehicle (EV) traction battery, said cellsim comprising a discharge capacitor switchably controlled to provide energy to a battery control module (BCM) for said traction battery; and
   wherein said discharge capacitor is coupled to a link between said cellsim and said BCM to hot plug test said BCM, and decoupled from said link to simulate an electric vehicle drive mode condition of said traction battery.

12. The battery simulator of claim 11, further comprising at least one cellsim control module (CCM) configured to control operation of at least one said cellsim.

13. The battery simulator of claim 11, wherein said cellsim comprises a DC/DC converter configured for bidirectional energy transfer with said BCM.

14. The battery simulator of claim 11, wherein said discharge capacitor is switchably coupled to a DC/DC converter.

15. The battery simulator of claim 11, wherein said discharge capacitor is switchably coupled to a voltage bus configured to couple said DC/DC converter to said BCM.

16. The battery simulator of claim 11, wherein said simulator is configured to monitor said cellsim output and provide a fault response when said cellsim output indicates a fault condition.

17. The battery simulator of claim 4, wherein a bulk capacitor is disposted at a first side of said converter, and said discharge capacitor is disposed at a second side of said converter.

* * * * *